United States Patent
Murakami

[11] Patent Number: 5,610,080
[45] Date of Patent: Mar. 11, 1997

[54] METHOD FOR PRODUCING SEMICONDUCTOR DEVICE HAVING A BODY WITH A CARRIER RING CONNECTED THERETO

[75] Inventor: Yoji Murakami, Kawasaki, Japan

[73] Assignee: Fujitsu Ltd., Kawasaki, Japan

[21] Appl. No.: 526,228

[22] Filed: Sep. 11, 1995

Related U.S. Application Data

[62] Division of Ser. No. 21,579, Feb. 24, 1993, Pat. No. 5,473,199.

[30] Foreign Application Priority Data

Mar. 2, 1992 [JP] Japan ................................ 4-044861

[51] Int. Cl.$^6$ .................................................. H01L 21/66
[52] U.S. Cl. ............................ 437/8; 437/209; 437/214; 437/217; 437/219
[58] Field of Search .............................. 437/8, 209, 214, 437/217, 219, 220

[56] References Cited

U.S. PATENT DOCUMENTS

| | | | |
|---|---|---|---|
| 4,301,464 | 11/1981 | Otsuki et al. | 257/670 |
| 4,475,007 | 10/1984 | Ohno | 437/217 |
| 4,701,781 | 10/1987 | Sankhagowit | 257/671 |
| 4,837,184 | 6/1989 | Lin et al. | 437/217 |
| 4,897,602 | 1/1990 | Lin et al. | 324/158 F |
| 5,114,880 | 5/1992 | Lin | 437/220 |
| 5,192,681 | 3/1993 | Chiu | 437/220 |
| 5,198,888 | 3/1993 | Sugano et al. | 257/686 |
| 5,422,163 | 1/1995 | Kamiyama et al. | 437/219 |

FOREIGN PATENT DOCUMENTS

| | | | |
|---|---|---|---|
| 53-24266 | 6/1978 | Japan . | |
| 55-24477 | 2/1980 | Japan | 257/677 |
| 59-103363 | 6/1984 | Japan | 257/666 |

Primary Examiner—Kevin Picardat
Attorney, Agent, or Firm—Staas & Halsey

[57] ABSTRACT

A semiconductor device includes a semiconductor device body, a ring part, and connecting parts. The semiconductor device body includes a resin package and a plurality of leads extending outwardly from the resin package. The ring part is made of a resin and surrounds the semiconductor device body. The connecting parts are made of a resin and connect the semiconductor device body and the ring part, so that the semiconductor device body is supported by the ring part via the connecting parts.

7 Claims, 4 Drawing Sheets

ID A METHOD FOR PRODUCING SEMICONDUCTOR DEVICE HAVING A BODY WITH A CARRIER RING CONNECTED THERETO

This application is a division of application Ser. No. 08/021,579, filed Feb. 24, 1993, now U.S. Pat. No. 5,473,199.

BACKGROUND OF THE INVENTION

The present invention generally relates to semiconductor devices and methods of producing the same, and more particularly to a semiconductor device which is made up of a semiconductor device body and a ring part which holds the semiconductor device body, and to a method of producing such a semiconductor device.

Recently, the integration density of semiconductor devices has improved considerably. On the other hand, there are demands to reduce the size of semiconductor devices. As a result, leads of the semiconductor devices are being arranged at extremely small intervals, that is, extremely narrow pitch.

The strength of the leads deteriorates if the pitch of the leads becomes narrow. For this reason, if the leads are deformed by an external force when the semiconductor device is transported, a short-circuit may be generated by the deformed leads thereby deteriorating the reliability of the semiconductor device.

For this reason, semiconductor devices having a mold carrier ring (MCR) have been proposed. According to a semiconductor device employing the MCR, a ring which holds the semiconductor device surrounds the semiconductor device so as to prevent the deformation of the leads.

FIG. 1 shows an example of a conventional semiconductor device employing an MCR. A semiconductor device 1 shown in FIG. 1 is generally made up of a semiconductor device body 2 and a ring part 3. This semiconductor device 1 is transported from a semiconductor device producing factory to a destination in the state shown in FIG. 1, that is, in a state where the ring part 3 is not yet removed from the semiconductor device body 2.

The semiconductor device body 2 includes a semiconductor chip (not shown) which is encapsulated within a resin package 4, and a plurality of leads 5 which extend outwardly from the peripheral parts of the resin package 4. On the other hand, the ring part 3 has a frame shape which surrounds the semiconductor device body 2. The ring part 3 is also made of a resin.

The tip end of each lead 5 which extends outwardly from the resin package 4 is embedded in the ring part 3. Hence, the semiconductor device body 2 is supported by the ring part 3 via the leads 5. Further, since the leads 5 penetrate the ring part 3 and are exposed at the outer peripheral part of the ring part 3, it is possible to test the characteristics of the semiconductor device body 2 via the exposed leads 5.

Because the tip ends of the leads 5 are embedded in the ring part 3 and the semiconductor device body 2 is held by the ring part 3 via the leads 5, it is possible to prevent deformation of the leads 5 even if an external force is applied on the ring part 3. For this reason, it is possible to prevent the leads 5 from becoming short-circuited even if the leads 5 are arranged at a narrow pitch, and it is also possible to maintain the leads 5 flat.

Therefore, according to such a conventional semiconductor device 1 employing an MCR, the semiconductor device body 2 and the ring part 3 are independent parts, and the semiconductor device body 2 and the ring part 3 are connected via the leads 5. In addition, the semiconductor device 1 is transported in a state where the ring part 3 is attached so as to prevent deformation of the leads 5. The ring part 3 is disconnected from the semiconductor device body 2 at the destination where the semiconductor device body 2 is actually mounted on electronic equipment or the like.

For this reason, there has been a problem in that the destination must be equipped with an apparatus for removing the ring part 3 from the semiconductor device body 2. More particularly, the destination must be equipped with a lead cutting apparatus for cutting the leads 5 at a predetermined position. This lead cutting apparatus must be able to cut the leads 5 which are arranged at a predetermined narrow pitch without deforming the leads 5 and maintaining the predetermined narrow pitch. However, a lead cutting apparatus which can satisfy such demands is expensive, and there has been a problem in that it is difficult to actually equip each destination of the semiconductor device 1 with such an expensive lead cutting apparatus.

SUMMARY OF THE INVENTION

Accordingly, it is a general object of the present invention to provide a novel and useful semiconductor device and a method of producing the same, in which the problems described above are eliminated.

Another and more specific object of the present invention is to provide a semiconductor device comprising a semiconductor device body including a resin package and a plurality of leads extending outwardly from the resin package, a ring part made of a resin and surrounding the semiconductor device body, and a plurality of connecting parts made of a resin and connecting the semiconductor device body and the ring part, so that the semiconductor device body is supported by the ring part via the connecting parts. According to the semiconductor device of the present invention, it is possible to positively prevent deformation of the leads even when an external force is applied to the ring part. In addition, it is possible to facilitate the operation of disconnecting the semiconductor device body from the ring part, and no expensive cutting apparatus is necessary to make this disconnection.

Still another object of the present invention is to provide a method of producing a semiconductor device comprising the steps of (a) forming a semiconductor device assembly including a semiconductor device body which is supported by a ring part via connecting parts, where the semiconductor device body includes a resin package and a plurality of leads extending outwardly from the resin package, the ring part is made of a resin and surrounds the semiconductor device body so that tip ends of the leads are embedded in the ring part and the connecting parts are made of a resin and connect the semiconductor device body and the ring part, and (b) cutting the leads in a vicinity of the ring part so that tip ends of the leads are separated from the ring part. According to the method of producing the semiconductor device of the present invention, it is possible to cut the leads after the semiconductor device body is tested, so as to prevent damage to the leads during the test operation. In addition, if the resin package, the ring part and the connecting parts are made of the same resin and formed in one molding process, it is possible to prevent the production process from becoming complex even though the connecting parts are additionally formed, and no special processes are necessary that would increase the production cost of the semiconductor device.

Other objects and further features of the present invention will be apparent from the following detailed description when read in conjunction with the accompanying drawings.

DESCRIPTION OF THE PREFERRED EMBODIMENTS

Figure 2:
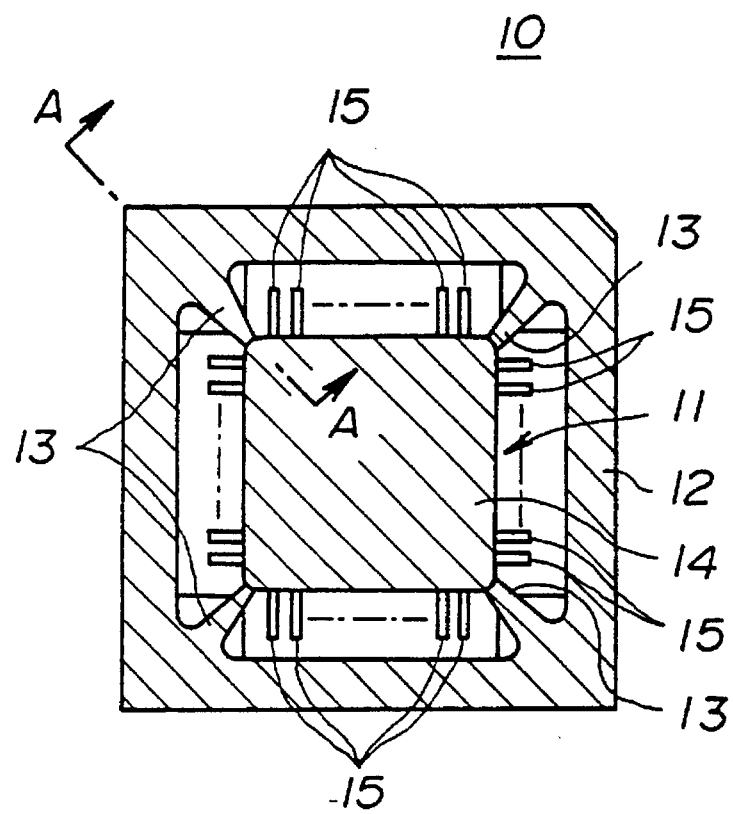
FIG. 2 is a plan view generally showing an embodiment of a semiconductor device according to the present invention employing a mold carrier ring.
Figure 3:
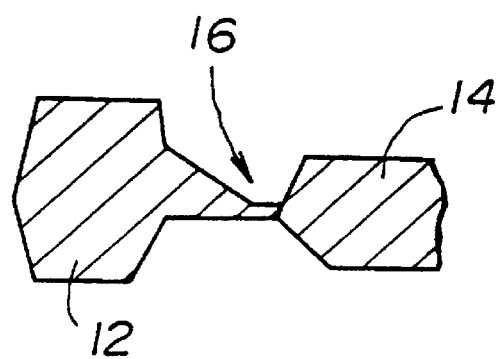
FIG. 3 is a sectional side view taken along line A—A of FIG. 2 showing a notch part of the semiconductor device on an enlarged scale.

First, a description will be given of an embodiment of a semiconductor device according to the present invention, by referring to FIGS. 2 and 3. FIG. 2 shows this embodiment in a plan view, and FIG. 3 shows a notch part of this embodiment in an enlarged sectional side view.

A semiconductor device 10 shown in FIG. 2 is generally made up of a semiconductor device body 11, a ring part 12, and connecting parts 13 which form an essential part of the present invention. This semiconductor device 10 employs an MCR. Hence, when the semiconductor device 10 is transported from a semiconductor device producing factory to a destination, the semiconductor device body 11 and the ring part 12 are integrally connected via the connecting parts 13. The ring part 12 and the connecting parts 13 are disconnected from the semiconductor device body 11 at the destination. Hence, only the semiconductor device body 11 is actually mounted on electronic equipment (not shown) or the like.

The semiconductor device body 11 is made up of a resin package 14 which encapsulates a semiconductor chip (not shown), and a plurality of leads 15 which extend outwardly from the outer peripheral part of the resin package 14. On the other hand, the ring part 12 is also made of a resin, and has a frame shape which surrounds the semiconductor device body 11. As clearly shown in FIG. 3, the thickness of ring part 12 is greater than the thickness of resin package 14 of the semiconductor device body 11.

The connecting parts 13 connect the resin package 14 to the ring part 12, and are also made of a resin. The connecting parts 13 connect the four outer corner parts of the generally rectangular resin package 14 to the four inner corner parts of the ring part 12. Accordingly, the semiconductor device body 11 is held by the ring part 12 via the four connecting parts 13. The connecting parts 13 are provided at the four outer corner parts of the resin package 14 because the leads 15 are provided at the outer peripheral part of the resin package 14 excluding the four outer corner parts. Accordingly, the semiconductor device body 11 is held by the ring part 12 via the connecting parts 13 without affecting the arrangement of the leads 15.

Figure 1:
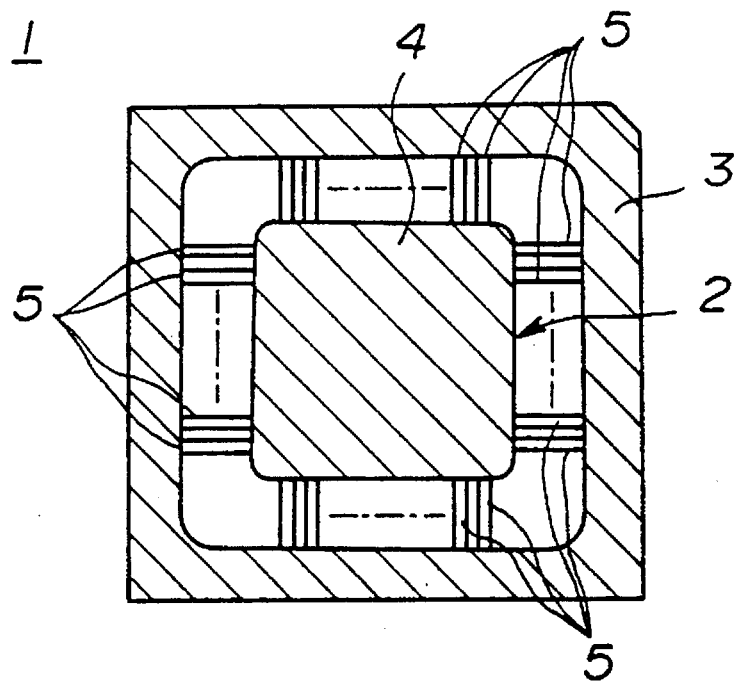
FIG. 1 is a plan view generally showing an example of a conventional semiconductor device employing a mold carrier ring.

The tip end of each lead 15 is separated from the ring part 12. In other words, unlike the conventional semiconductor device 1 shown in FIG. 1, the ring part 12 holds the semiconductor device body 11 via only the connecting parts 13 and not via the leads 15. Although the leads 15 do not connect to the ring part 12, the semiconductor device body 11 is positively held by the ring part 12 via the connecting parts 13. For this reason, even if an external force is applied to the semiconductor device 10 when being transported, the external force will not be applied to the leads 15, and the ring part 12 positively prevents deformation of the leads 15.

FIG. 3 shows the joint between the connecting part 13 and the resin package 14 along a line A—A in FIG. 2 on an enlarged scale. As shown in FIG. 3, the thickness of the resin is thinner at the joint between the connecting part 13 and the resin package 14, thereby forming a notch part 16. Because this notch part 16 is thin, the notch part 16 is weaker than other parts of the connecting part 13. Hence, when disconnecting the semiconductor device body 11 from the ring part 12 as will be described later, the semiconductor device body 11 is disconnected from the connecting part 13 at the notch part 16. Of course, the thickness of the notch part 16 is selected so that the notch part 16 can withstand the external force which may be applied to the semiconductor device 10 when being transported.

As described above, the semiconductor device 10 is transported to a destination in the state where the ring part 12 is connected to the semiconductor device body 11 as shown in FIG. 2, and the ring part 12 is disconnected from the semiconductor device body 11 at the destination.

The following disconnecting operation is carried out at the destination. First, the semiconductor device body 11 is placed on a jig or the like. Then, the ring part 12 is disconnected from the semiconductor device body 11 by applying pressure from above the ring part 12, so that the connecting parts 13 break at the notch parts 16. The ring part 12 is disconnected from the semiconductor device body 11 by this simple operation of pressing the ring part 12 from above the ring part 12, because the leads do not make contact with the ring part 12 and thus do not need to be cut and because the connecting parts 13 which connect the ring part 12 and the semiconductor device body 11 are made of a resin and the notch parts 16 are formed at the breaking points.

Since the ring part 12 can be disconnected from the semiconductor device body 11 by the simple operation of applying pressure from above the ring part 12, it is unnecessary to equip each destination with the expensive lead cutting apparatus for cutting the leads with a high accuracy. As a result, it is possible to reduce the load, that is, the equipment cost, at each destination.

Figure 6:
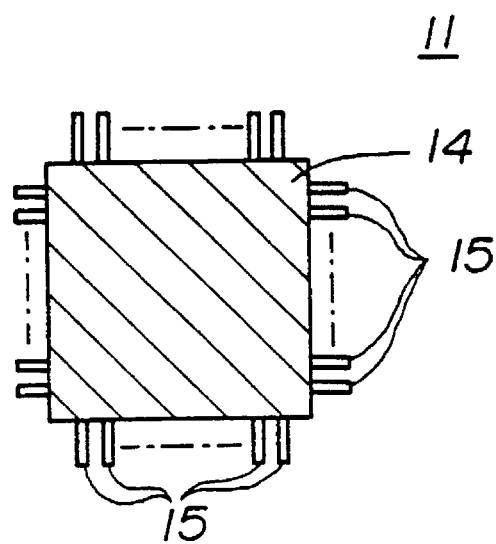
FIG. 6 is a plan view showing a semiconductor device body in a state where a ring part is removed.

FIG. 6 shows the semiconductor device body 11 after the ring part 12 has been disconnected. As may be seen from FIG. 6, the semiconductor device body 11 itself is basically the same as the conventional semiconductor device body 2 shown in FIG. 1, for example.

Figure 4:
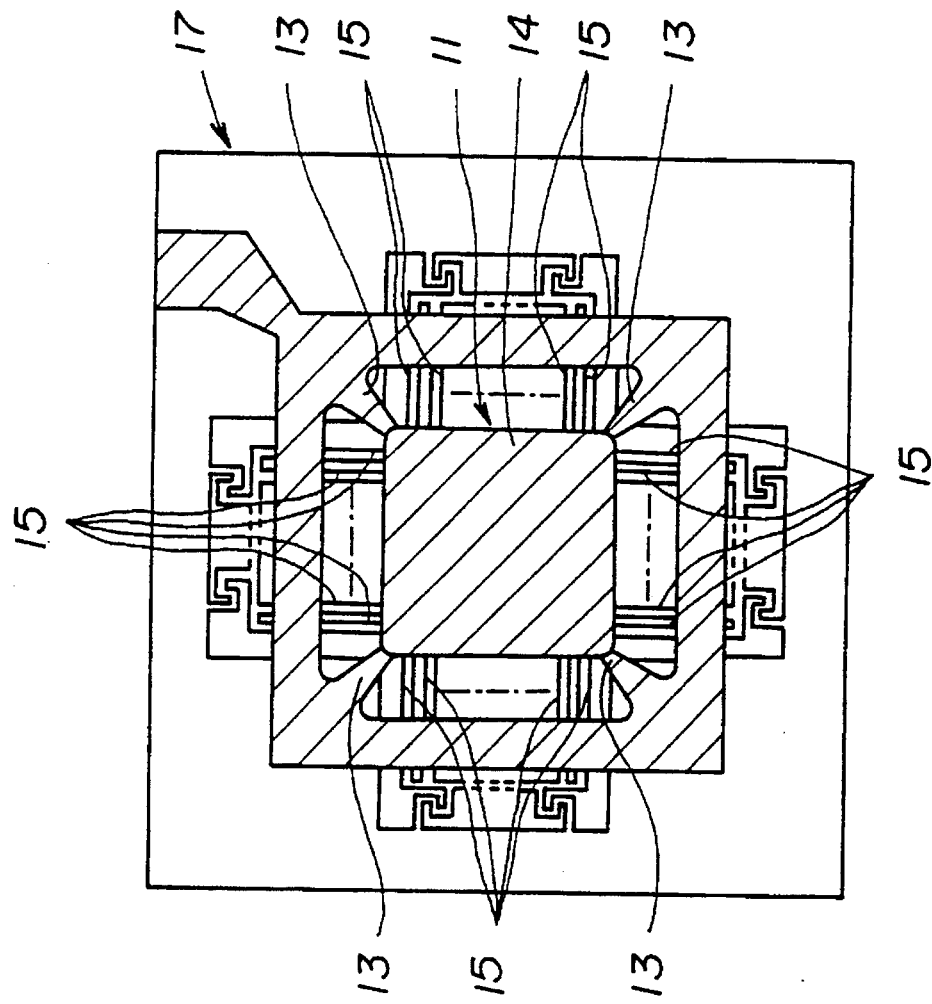
FIG. 4 is a plan view for explaining an embodiment of a method of producing the semiconductor device according to the present invention.
Figure 5:
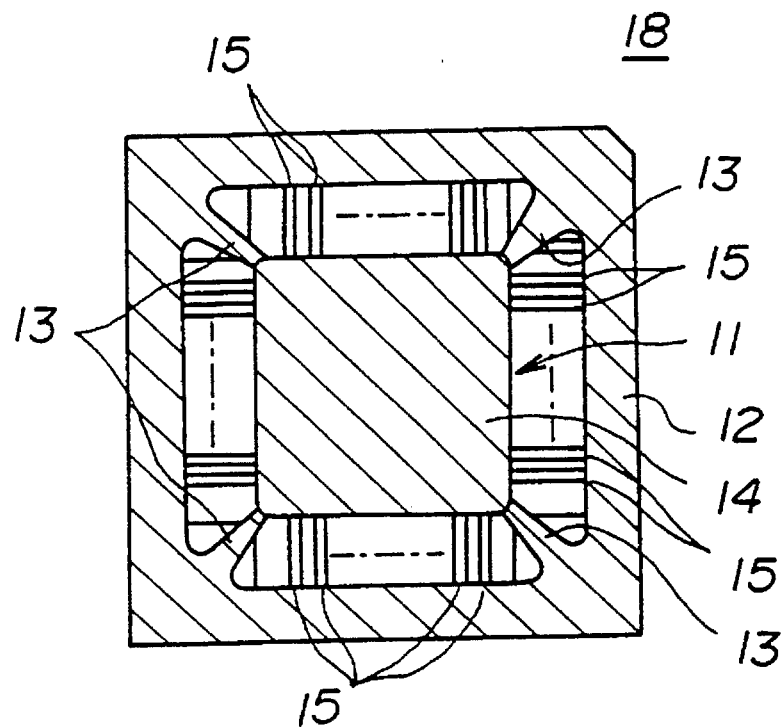
FIG. 5 is a plan view for explaining the embodiment of the method of producing the semiconductor device according to the present invention.

Next, a description will be given of an embodiment of a method of producing the semiconductor device according to the present invention, by referring to FIGS. 4 through 6. In this embodiment of the method, it will be assumed for the sake of convenience that the semiconductor device 10 shown in FIG. 2 is produced. In FIGS. 4 through 6, those parts which are the same as those corresponding parts in FIGS. 2 and 3 are designated by the same reference numerals, and a description thereof will be omitted.

First, a lead frame 17 shown in FIG. 4 and having a predetermined shape is formed by a press or the like. A semiconductor chip (not shown) is mounted on this lead frame 17 by a die-bonding, and inner leads of the leads 15 are wire-bonded to the semiconductor chip. The formation of the lead frame 17, the die-bonding of the semiconductor chip and the wire-bonding of the inner leads can be carried out by known methods. Next, the lead frame 17 mounted with the semiconductor chip is placed in dies or metallic molds, and a resin molding process is carried out to form the ring part 12, the connecting parts 13 and the resin package 14 in one process. The notch parts 16 are also formed when the connecting parts 13 are formed.

Because the ring part 12, the connecting parts 13 and the resin package 14 are formed in one process, the provision of the resin connecting parts 13 does not make the production process more complex. Of course, it is possible to form the ring part 12, the connecting parts 13 and the resin package 14 by independent molding processes. In such a case, it is possible to form the ring part 12, the connecting parts 13 and the resin package 14 from resins suited for each purpose.

FIG. 4 shows the lead frame 17 after the ring part 12, the connecting parts 13 and the resin package 14 are formed. The process of molding the ring part 12, the connecting parts 13 ahd the resin package 14 simply requires the design of the dies or metallic molds to be changed at parts corresponding to the connecting parts 13 if forming the ring part 12, the connecting parts 13 and the resin package 14 in one process, and no special steps in the procedure are required. In other words, only different dies or metallic molds are required, and the conventional steps of procedure can be employed to form the ring part 12, the connecting parts 13 and the resin package 14. Therefore, there is no need to greatly modify the conventional production line, and the increase of the production cost due to the provision of the connecting parts 13 can be minimized.

Thereafter, the unwanted parts of the lead frame 17 shown in FIG. 4 are removed, so as to form a semiconductor device assembly 18 shown in FIG. 5. The construction of this semiconductor device assembly 18 is basically the same as that of the semiconductor device 10 shown in FIG. 2, except that the tip ends of the leads 15 are still embedded in the ring part 12 in FIG. 5. In addition, the leads 15 are electrically connected to each other at parts of the lead frame 17 in the state shown in FIG. 4, but in the state shown in FIG. 5, the leads 15 are electrically isolated from each other because the unwanted parts of the lead frame 17 are removed. In addition, in the state shown in FIG. 5, the leads 15 are relatively strong because each lead 15 has both ends thereof respectively held by the ring part 12 and the resin package 14.

The characteristics of the semiconductor device body 11 are thus tested in the state shown in FIG. 5 to determine whether or not the semiconductor device body 11 carries out its designed functions. When making this test, contacts of a testing apparatus (not shown) make contact with the leads 15, but the leads 15 will not be deformed by such contacts because the leads 15 are sufficiently strong as described above. After this test ends, each lead 15 is cut at a predetermined position in a vicinity of the ring part 12, and the semiconductor device 10 shown in FIG. 2 is formed as a result.

As described above, the ring part 12 is disconnected from the semiconductor device body 11 at each destination, and the semiconductor device body 11 shown in FIG. 6 is finally obtained.

Instead of providing the connecting part 13 of this embodiment, it is conceivable to provide the connecting parts on the lead frame. In this case, the semiconductor device body will be held by the ring part via the metal connecting parts. According to this conceivable construction, the construction of the cutting apparatus at the destination can be simplified compared to that required for the conventional semiconductor device shown in FIG. 1, but the process of cutting the metal connecting parts is troublesome compared to cutting or breaking the resin connecting parts 13 as in the embodiment. Therefore, it is more convenient to employ the resin connecting parts 13 than the metal connecting parts.

In the described embodiments, the connecting parts are provided at all four corner parts of the resin package. However, the connecting parts may be provided at any part of the resin package where no lead is provided. However, when the connecting parts are provided at the corner parts of the resin package, it is possible to more positively prevent damage to the leads when disconnecting the semiconductor device body from the ring part because the distance between the connecting parts and the adjacent leads becomes relatively large in this case.

On the other hand, it is possible to support the semiconductor device body by only two or three connecting parts if such a support is sufficient to prevent deformation of the leads when the semiconductor device is transported.

Further, the present invention is not limited to these embodiments, but various variations and modifications may be made without departing from the scope of the present invention.

What is claimed is:

1. A method of producing a semiconductor device comprising the steps of:

(a) forming a semiconductor device assembly including a semiconductor device body which is supported by a ring part via connecting parts, said semiconductor device body including a resin package and a plurality of leads extending outwardly from the resin package, said ring part being made of a resin and surrounding said semiconductor device body so that tip ends of the leads are embedded in the ring part, said connecting parts being made of a resin and connecting said semiconductor device body and said ring part; and (b) cutting the leads in a vicinity of the ring part so that tip ends of the leads are separated from the ring part.

2. The method of producing the semiconductor device as claimed in claim 1, wherein said step (a) forms the resin package, said ring part and said connecting parts from the same resin.

3. The method of producing the semiconductor device as claimed in claim 2, wherein said step (a) forms the resin package, said ring park and said connecting parts in one resin molding process.

4. The method of producing the semiconductor device as claimed in claim 1, which further comprises the step of:

(c) disconnecting the semiconductor device body from the ring part.

5. The method of producing the semiconductor device as claimed in claim 4, wherein said step (c) breaks each connecting part by applying pressure to the ring part.

6. The method of producing the semiconductor device as claimed in claim 1, which further comprises the step of:

(c) testing the semiconductor device body.

7. The method of producing the semiconductor device as claimed in claim 6, wherein said step (b) is carried out after said steps (a) and (c) are carried out in this order.

* * * * *